June 11, 1957 A. M. SCANDURRA ET AL 2,795,655

REGENERATIVE COMPENSATION OF RADIO FREQUENCY AMPLIFIERS

Filed Oct. 7, 1954

INVENTORS
ALDO M. SCANDURRA
ROBERT J. HANNON

BY

Ostrolenk & Faber

ATTORNEYS

United States Patent Office 2,795,655

Patented June 11, 1957

2,795,655

REGENERATIVE COMPENSATION OF RADIO FREQUENCY AMPLIFIERS

Aldo M. Scandurra, New York, and Robert J. Hannon, Huntington Station, N. Y., assignors to Standard Coil Products Co., Inc., Los Angeles, Calif., a corporation of Illinois Application October 7, 1954, Serial No. 460,814

1 Claim. (Cl. 179—171)

The present invention relates to radio frequency amplifiers and more particularly it relates to a radio frequency amplifier using regenerative compensation.

In the front end of a television receiver it is necessary to have not only a low noise but also a high gain amplifier such as, for example, the amplifier known in the trade as the "cascode amplifier." Such an amplifier can be shown to have a very low noise figure and considerable gain.

A cascode amplifier, however, uses two triodes generally in a single envelope, the first of which operates with the cathode grounded, the second with its grid grounded.

This amplifier must, therefore, be provided with a number of electrical components to complete the circuits of the two triodes.

With the advent of high transconductance triodes attempts were made to use them in a single tuned grounded grid amplifier. As is well-known in the art, grounded grid amplifiers have a cathode input and plate output, and the grid is effectively grounded at radio frequencies. Such amplifiers also have low noise, but it was found that in the frequency range up to approximately 300 megacycles because of electron coupling in the tube between the cathode and the plate, a degenerative effect arose which cut the gain down in this frequency range.

It was found, in particular, that at these frequencies the band width could be changed without any noticeable change in the gain of the amplifier. This degenerative effect is due to the fact that through electron coupling a current flows in the input circuit which is 180° out of phase with respect to the input current, thus causing a decrease in the magnitude of the input signal to the tube.

The present invention provides means for more than doubling the db gain of a grounded grid amplifier in the frequency region up to 300 megacycles.

Thus, the main object of the present invention is the provision of means for raising the gain of a grounded grid radio frequency amplifier.

Essentially, by the provision of appropriate circuitry, regeneration is used to raise the gain of the amplifier.

Thus, another object of the present invention is a high gain regeneratively compensated radio frequency amplifier.

Such regeneration is obtained in the present invention by connecting the grid terminal to ground through an inductance having a magnitude such that the desired regeneration takes place.

Still another object of the present invention is, therefore, the provision of a compensating element in the grid circuit of a radio frequency amplifier to provide regeneration and, therefore, an increase in gain of this amplifier.

It is found experimentally that the noise figure is not appreciably changed by the addition of this compensating inductance in the grid circuit, while the gain in db may be increased to more than twice its value without regenerative compensation.

It is further found that with regenerative compensation, a change in band width produces a change in gain and that the desired band width can be obtained with a high gain without causing instability in the amplifier.

The foregoing and many other objects of the invention will become apparent in the following description and drawings in which.

Figure 1:
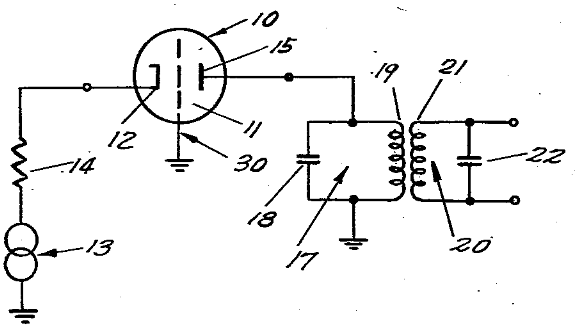
Figure 1 is a schematic circuit diagram of a conventional grounded grid amplifier with a double tuned output circuit.

Referring first to Figure 1 showing the radio frequency circuit of a conventional grounded grid amplifier having a double tuned output, the amplifier tube 10 having a high $g_m$ transconductance, for example from 10,000 to 15,000 micromhos, has its grid 11 grounded at radio frequencies. Its cathode 12 is shown connected to a generator 13 having series impedance 14. The plate 15 is connected to a tuned circuit 17 consisting of capacitance 18 and inductance 19 mutually coupled to a second tuned circuit 20 consisting of inductance 21 and capacitance 22.

To the second tuned circuit 20 is connected the utilization circuit, for example the input to a mixer if this radio frequency amplifier is to be used in a television tuner.

It is found that when an amplifier such as the one described in connection with Figure 1 is used in the frequency range up to 300 megacycles, because of high degeneration due to electron coupling in the tube 10 between the plate circuit and the input circuit the gain is relatively low.

It is further found that because of this high degeneration when the band width is changed, for example by varying the coefficient of coupling between inductances 19 and 21 or the mutual inductance between coils 19 and 21, the gain remains essentially constant instead of varying inversely with the band width as expected.

Figure 2:
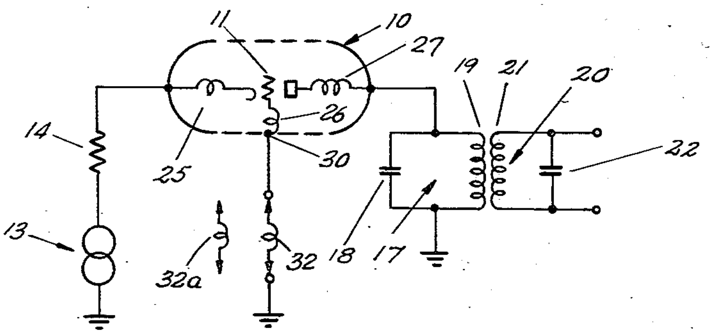
Figure 2 is a schematic circuit diagram of the regeneratively compensated radio frequency amplifier of the present invention showing a compensating inductance in the grid circuit and the lead inductances of the triode electrodes.

Referring now to Figure 2 showing the schematic circuit diagram of the radio frequency amplifier of the present invention, tube 10 is here shown with its lead inductances, namely lead inductance 25 for the cathode lead, inductance 26 for the grid lead and inductance 27 for the plate lead.

All the elements which were described in Figure 1 are here denoted by the same numerals.

In the radio frequency amplifier in Figure 2, however, grid 11 or better its terminal or pin 30 is not directly connected to ground as shown in Figure 1 but is connected to ground through a series inductance 32. The function of series inductance 32 is to provide regeneration in tube 10 so as to increase the total gain of the amplifier. It is found, in fact, that by the addition of inductance 32 it is possible to increase the gain in the frequency region up to 300 megacycles from the value 12 db's to approximately 20 db's or a change of practically 2:1.

Furthermore, in the amplifier of Figure 2, if the coefficient of coupling between inductances 19 and 21 of the tuned circuits 17 and 20 is changed, the gain will change in the opposite direction as will be expected because of the decrease in the degenerative effect. The above values of gain were, in fact, obtained with a band width of approximately 3 megacycles.

In order to maintain constant gain over the desired frequency range, for example, in the V. H. F. range from 50 to approximately 300 megacycles, it is necessary to provide a number of coils such as 32 switchable in the circuit of Figure 2 to provide the necessary regeneration. One such coil is shown as coil 32*a* which is connectible between pin 30 and ground when inductor 32 is disconnected therefrom.

It is also possible to use instead of the single coil 32 of Figure 2 a broad banding circuit consisting, for example, of a coil and a shunt resistance. By such means the amplifier shown in Figure 2 may be used as a radio frequency amplifier of a V. H. F. television tuner.

During operation in the U. H. F. region, pin 30 of tube 10 may be grounded directly since in the U. H. F. region from approximately 500 to 1,000 megacycles, the grid lead inductance 26 is sufficient to provide the necessary regeneration.

Thus, the novel circuit of the present invention may be used as a radio frequency amplifier in the whole television spectrum from approximately 50 megacycles to 900 megacycles with a high gain, low noise figure and considerable economy in the number of components used.

In the foregoing the invention has been described solely in connection with specific illustrative embodiments thereof. Since many variations and modifications of the invention will now be obvious to those skilled in the art, we prefer to be bound not by the specific disclosures herein contained but only by the appended claim.

We claim:

In a V. H. F. amplifier for a television tuner, a high transconductance triode having a plate, cathode and grid, each of said plate, cathode and grid having lead inductance, an input circuit being connectible to said cathode and a tunable output circuit being connectible to said plate; circuit connections for grounding said grid and a plurality of inductors individually connectible in said circuit connections; each of said inductors being individually selectively connected in said circuit connections in accordance with the frequency tuned by said output circuit, the inductance of each of said inductors being functionally related to said grid lead inductance and the corresponding tuned frequency at which said inductors are connected in said circuit connections, each of said inductors providing regeneration to raise the gain of said amplifier at their corresponding tuned frequencies.

References Cited in the file of this patent

UNITED STATES PATENTS

| | | |
|---|---|---|
| 2,247,442 | Labin | July 1, 1941 |
| 2,431,333 | Labin | Nov. 25, 1947 |
| 2,691,078 | Gluyas | Oct. 5, 1954 |